US007378834B2

(12) United States Patent
Hofmeister et al.

(10) Patent No.: US 7,378,834 B2
(45) Date of Patent: May 27, 2008

(54) ELECTRONIC ASSEMBLY TESTER AND METHOD FOR OPTOELECTRONIC DEVICE

(75) Inventors: Rudolf J. Hofmeister, Sunnyvale, CA (US); Konstantinos G. Haritos, Saratoga, CA (US); John C. Dirkson, Santa Clara, CA (US); Samantha R. Bench, Whitefish, MT (US)

(73) Assignee: Finisar Corporation, Sunnyvale, CA (US)

( * ) Notice: Subject to any disclaimer, the term of this patent is extended or adjusted under 35 U.S.C. 154(b) by 620 days.

(21) Appl. No.: 10/695,344

(22) Filed: Oct. 28, 2003

(65) Prior Publication Data

US 2004/0092135 A1 May 13, 2004

Related U.S. Application Data

(60) Provisional application No. 60/422,205, filed on Oct. 29, 2002.

(51) Int. Cl.
*G01R 31/28* (2006.01)

(52) U.S. Cl. .................................................. 324/158.1

(58) Field of Classification Search .................... None
See application file for complete search history.

(56) References Cited

U.S. PATENT DOCUMENTS

| | | | | | |
|---|---|---|---|---|---|
| 4,056,773 | A | * | 11/1977 | Sullivan | 324/500 |
| 5,757,998 | A | * | 5/1998 | Thatcher et al. | 385/75 |
| 6,074,220 | A | * | 6/2000 | Roberts | 439/67 |
| 6,077,124 | A | * | 6/2000 | Etters et al. | 439/632 |
| 6,086,412 | A | * | 7/2000 | Watt et al. | 439/496 |
| 2004/0091231 | A1 | | 5/2004 | Hofmeister et al. | |
| 2006/0052969 | A1 | * | 3/2006 | Hunt et al. | 702/130 |
| 2006/0234540 | A1 | * | 10/2006 | Tipley et al. | 439/260 |

* cited by examiner

*Primary Examiner*—Jermele Hollington
(74) *Attorney, Agent, or Firm*—Workman Nydegger

(57) ABSTRACT

An electronic assembly tester for testing an electrical component of an optoelectronic device. The electrical component includes a transmit and receive port. The tester includes of a base, an arm, and a hinge. The arm includes a flex circuit and cables. The arm is rotated into a closed position to form a temporary electrical connection between the electrical component and the flex circuit. Other configurations for forming a temporary electrical connection between the test circuit and the electrical component are possible. The electrical component is evaluated by providing a data signal to the transmit portion of the electrical component and evaluating a return data signal obtained from the receive portion of the electrical component.

17 Claims, 12 Drawing Sheets

ELECTRONIC ASSEMBLY TESTER AND METHOD FOR OPTOELECTRONIC DEVICE

CROSS-REFERENCE TO RELATED APPLICATIONS

This application claims benefit of and priority to U.S. Provisional Application No. 60/422,205 filed Oct. 29, 2002 and entitled "Electronic Assembly Tester and Method for Optoelectronic Transceiver," which application is herein incorporated by reference in its entirety.

BACKGROUND OF THE INVENTION

1. The Field of the Invention

The present invention relates generally to the field of optoelectronic devices, and more specifically relates to an assembly and method for testing the electrical component of an optoelectronic device before optical components are attached.

2. The Relevant Technology

Optoelectronic devices, such as transceivers and transponders, are devices that are capable of performing two functions. First, a transmitting portion of an optoelectronic device receives electrical signals, translates the electrical signals to optical signals, and then transmits the optical signals. Second, a receiving portion of an optoelectronic device receives optical signals, translates the optical signals to electrical signals, and then transmits the electrical signals. Note that an optoelectronic device may have both transmitting and receiving capabilities, such as those found in a transceiver or transponder.

In the manufacture of optoelectronic devices, each device is tested to ensure that it functions properly before selling the device to a customer. Since optoelectronic devices operate in a variety of environments (with respect to temperature, supply voltage, and the like), the devices are preferably tested under conditions similar to those found in such operating environments.

Testing optoelectronic devices has, however, proven to be a costly activity. This cost is related to the fact that it is both expensive and difficult to disassemble or repair an optoelectronic device once its components have been assembled. Optoelectronic devices are composed of an electrical component and a pair of optical components. The electrical component transmits and receives electrical signals, whereas the optical components transmit and receive optical signals. An optoelectronic device will malfunction if the electrical component, the optical component, or their connection malfunctions.

Typically, an optoelectronic device is tested after it has been completely assembled. When an optoelectronic device is found to be malfunctioning, disassembling the optoelectronic device is time consuming, and thus expensive, and may render unusable the device's electrical component, optical components, or both. Further, for some types of malfunctions, testing the optoelectronic device as a whole makes it difficult to determine which component of the device is malfunctioning.

Thus, it would be beneficial to test the electrical component and the optical components of an optoelectronic device separately before these components are joined to form an optoelectronic device. In this way, manufacturing costs are reduced, malfunctions are more easily and accurately diagnosed, and fewer components are damaged. In addition, disassembly of the optoelectronic device is largely avoided.

SUMMARY OF THE INVENTION

An electrical component of an optoelectronic device is tested separately from the device's optical components. Manufacturing and testing costs are lowered by detecting malfunctioning electrical components prior to their assembly with the device's optical components.

Generally, the electrical component of the optoelectronic device includes a transmit port and a receive port. The transmit port and the receive port are ports that would be connected to the transmitter optical subassembly (TOSA) and receiver optical subassembly (ROSA), respectively, in a completed optoelectronic device.

The electrical component of an optoelectronic device is placed in an assembly that has a flex circuit and an attached cable to create a temporary connection between the transmit port and the receive port of the electrical component. The temporary connection is created by mechanically and temporarily pressing electrical traces of the flex circuit to the transmit and receive ports of the electrical component. Magnets, pressure fixtures, screws or other clamping mechanisms may be used to form a secure, temporary connection. An electrical signal is sent to the transmit circuitry of the electrical component. If the transmit and receive circuitry are at least partially functional and all necessary connections in the signal path are functional, the electrical signal travels through the transmit circuitry to the transmit port, the temporary connection, the receive port and the receive circuitry. The resulting return signal is then evaluated to detect any errors that may indicate a malfunctioning electrical component.

In one embodiment of the method, a host computer performs the test. A host computer is attached to the electrical component while the component is in the tester assembly. The host computer sends an electrical signal to the electrical transmit component, and then receives an electrical return signal from the electrical receiver component. The host computer then evaluates the return signal to determine whether the electrical component is functioning properly. In another embodiment, a bit error rate tester (BERT) transmits and receives the electrical signals.

In another aspect of the present invention, an electrical component is tested, using the same tester assembly, in a plurality of test apparatuses. The electrical component can also be tested in multiple test environments using the same tester assembly. In addition, multiple electrical components may be tested using the same tester assembly.

These and other advantages and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings, in which.

DETAILED DESCRIPTION OF THE PREFERRED EMBODIMENTS

Figure 1:
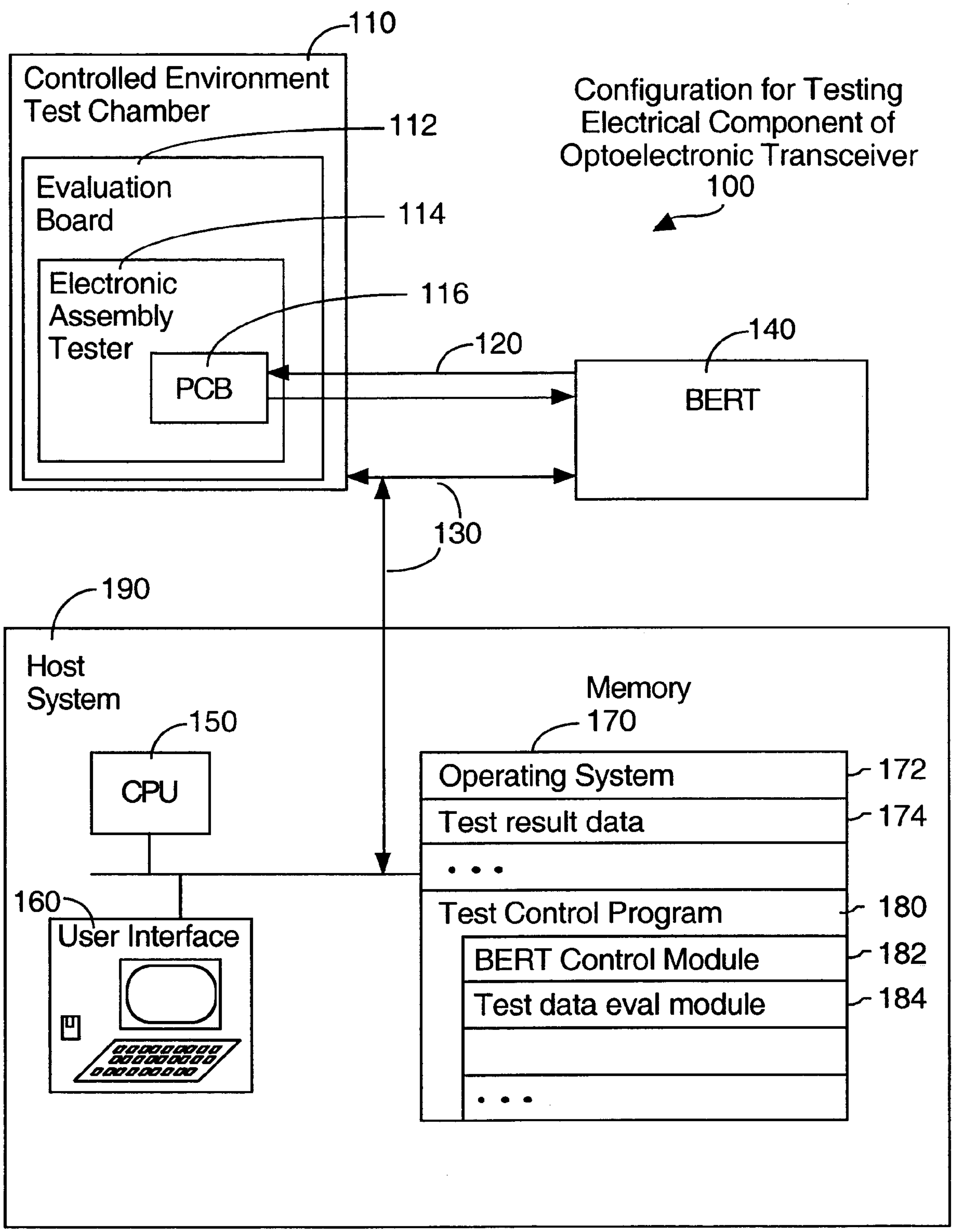
FIG. 1 illustrates a block diagram of a system depicting one configuration for testing the electrical component of an optoelectronic transceiver.

FIG. 1 shows an exemplary embodiment of a configuration 100 for testing the electrical component of an optoelectronic transceiver. While exemplary embodiments of the present invention describe transceivers, the present invention extends to any optoelectronic device including, but not limited to, transceivers, transponders, transmitters and receivers. The configuration allows an electrical component 116 (represented in FIG. 1 by one of its components, the printed circuit board (PCB)) of an optoelectronic device to be tested in certain environments, using a bit error rate tester (BERT) 140 to transmit and receive an electrical signal to and from the electrical component 116. The BERT 140 and the environment in which the electrical component 116 is tested are controlled by a host system 190.

In this embodiment, the electrical component 116 is contained in a printed circuit board (PCB) that sits in an electronic assembly tester 114. The electronic assembly tester 114 is connected to an evaluation board 112 and may optionally be placed in a controlled environment test chamber 110. The electrical component 116 is connected to a BERT 140, which transmits and receives test signals to and from the electrical component 116. The controlled environment test chamber 110 and the BERT 140 are both connected to a host system 190 via one or more control busses 130.

The host system 190 controls the conditions in the controlled environment test chamber 110. The host system 190 also controls the functioning of the BERT 140. The host system has a user interface 160, a CPU 150, and a memory 170. Memory 170 may include high speed random access memory and may also include non-volatile memory, such as one or more magnetic disk storage devices. Memory 170 may include mass storage that is remotely located from the central processing unit(s) 150. The memory 170 preferably stores an operating system 172, test result data 174, and a test control program 180. The test control program 180 may include a BERT control module 182 and a test data evaluation module 184. The operating system 172 stores instructions for communicating, processing data, accessing data, storing data, searching data, etc. The test result data 174 is test result data received from the BERT 140. The test control program 180 and BERT control module 182 include computer programs or procedures for controlling operation of the BERT 140 and for receiving test result data from the BERT. The test evaluation module 184 includes instructions for evaluating the test result data 174 to determine whether the electrical component 116 is functioning properly.

Figure 2:
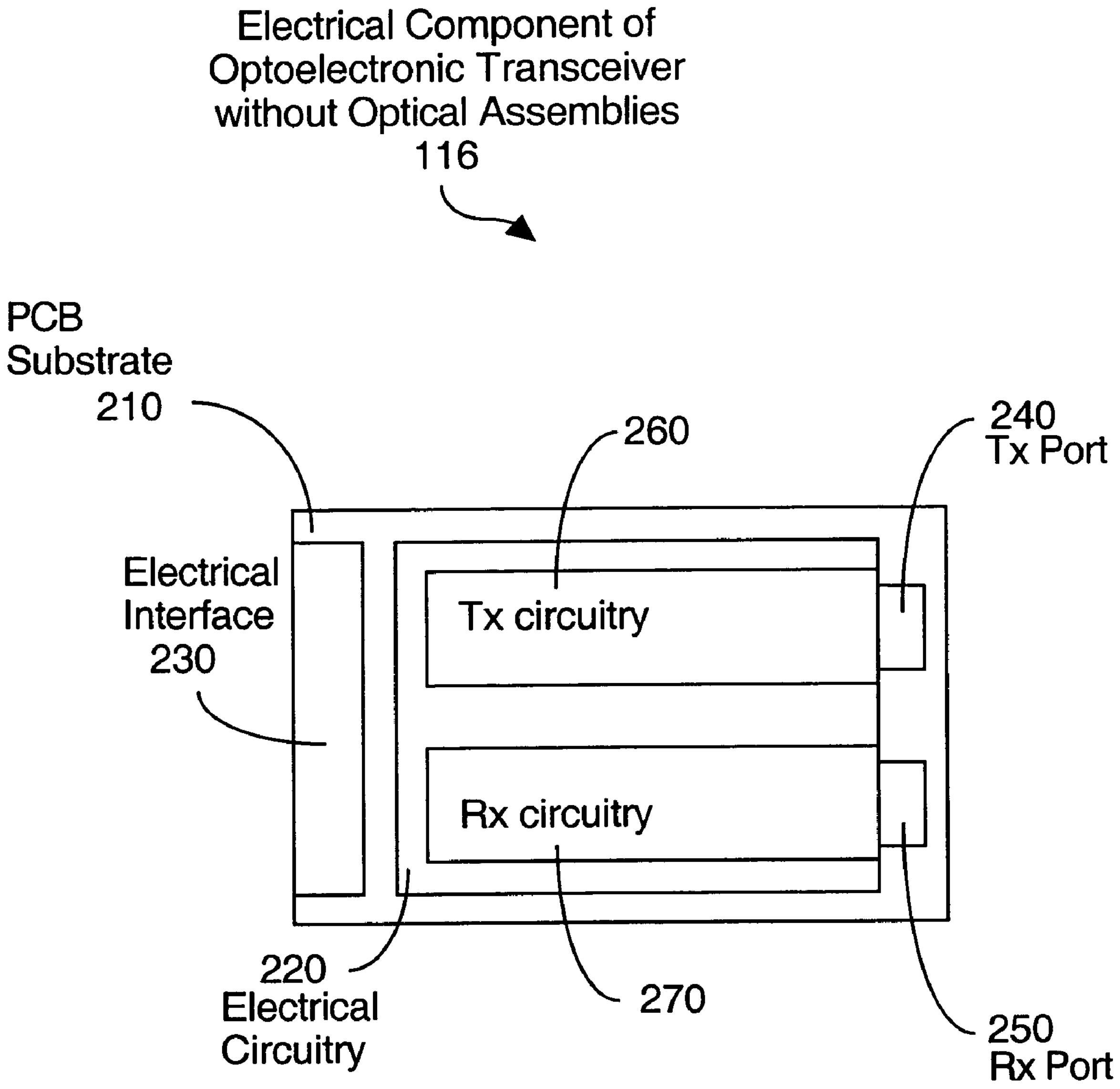
FIG. 2 is a block diagram of the electrical component of an optoelectronic transceiver without optical components attached.

In FIG. 2, the electrical component 116 of an optoelectronic transceiver is shown. The electrical component 116 is mounted on a printed circuit board (PCB) substrate 210. Electrical circuitry 220 on the PCB substrate 210 includes transmit (Tx) circuitry 260 and receive (Rx) circuitry 270. Attached to the transmit circuitry 260 and the receive circuitry 270 are the transmit port 240 and the receive port 250, respectively. In one embodiment, the transmit port 240 and receive port 250 are electrical pads located on the PCB 210. There is also an electrical interface 230 on the PCB substrate 210 for receiving and sending electrical data signals, power and ground voltages, and other signals.

Figure 3:
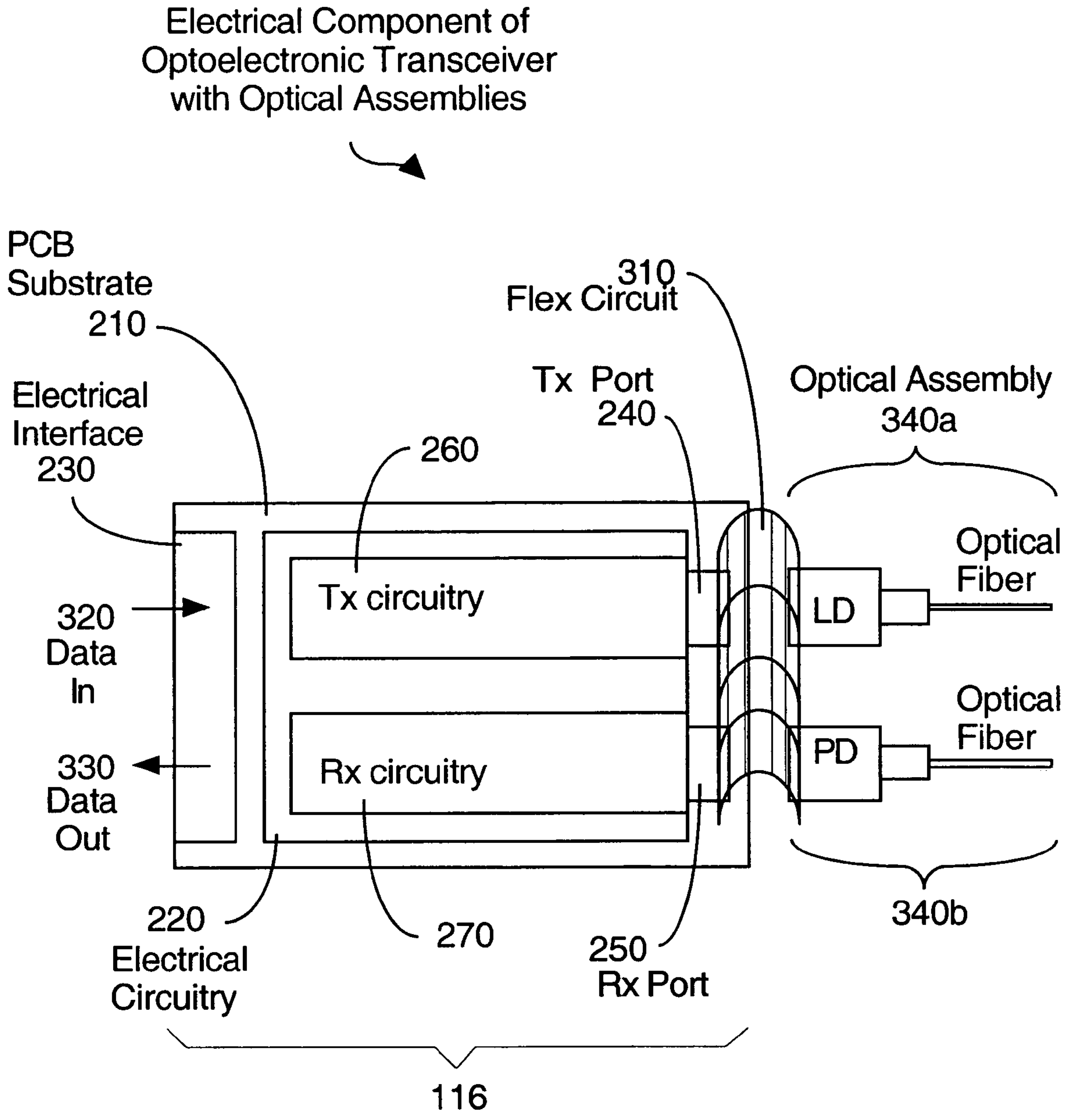
FIG. 3 is a block diagram of a complete optoelectronic transceiver with the electrical and optical components joined.

Referring to FIG. 3, when the electrical component 116 is attached to a pair of optical components 340 (including a laser diode (LD) and a photodiode (PD)) to form a completed optoelectronic transceiver, the electrical component's 116 electrical circuitry 220 allows electrical signals transmitted to the optoelectronic transceiver to be transferred to the optical components 340 through a transmit port 240, receive port 250, and a flex circuit 310 (e.g., a flexible substrate having conductive traces on the substrate). The flex circuit 310 conveys outbound data signals from the transmit circuitry 260 of the electrical component 116 to an output port 240, and conveys inbound data signals received at an input port 250 to the receive circuitry 270 of the electrical component 116.

Optical components 340 are called the transmitter optical subassembly (TOSA) 340*a* and the receiver optical subassembly (ROSA) 340*b*. The purpose of flex circuit 310, which is part of the optoelectronic transceiver when fully assembled, is not only to connect the electronic components within electrical component 116 to the optical components 340, but to do so with minimal signal reflections by providing impedance matched transmission lines for the signals being conveyed between the electrical component 116 and the optical components 340.

The electrical component 116 standing alone, though, is still capable of sending an electrical signal through its electrical circuitry 220. The electrical interface 230 serves as an input/output point where an external source (for example, a BERT 140) can be attached to send an electrical signal (Data In 320) to and receive an electrical signal (Data Out 330) from the electrical component 116.

Figure 4A:
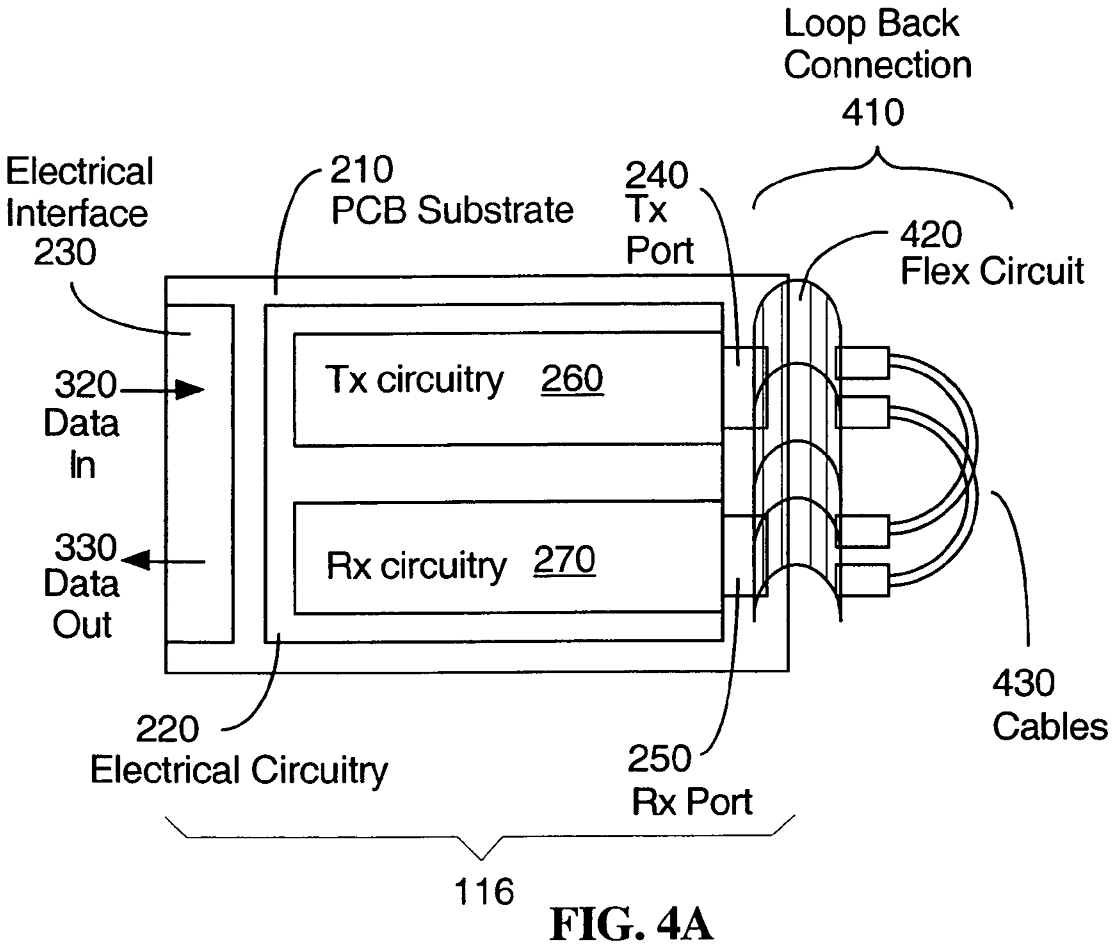
FIG. 4A is a block diagram of the electrical component of an optoelectronic transceiver coupled to a flexible circuit and a loop back connection.

In FIG. 4A, the electrical component 116 is shown connected to a loop back connection 410. Loop back connection 410 is composed of a flex circuit 420 and cables 430. Flex circuit 420 is a different flex circuit than the flex circuit 310 used in a completely assembled optoelectronic transceiver. In particular, unlike flex circuit 310, flex circuit 420 is designed to provide connections between the electrical component 116 and cables 430, and thus to be part of a loop back circuit.

Cables 430 are preferably coaxial cables to minimize signal loss in the loop back connection 410. In one embodiment, the cables 430 are matched length short coaxial cables. The loop back connection 410 sends electrical signals output at the transmit port 240 to the receive port 250. During testing, a Data In electrical signal 320 is transmitted into the electrical interface 230, and it flows through the transmit circuitry 260 and into the transmit port 240. The transmit port 240 then transmits the electrical signal to the loop back connection 410, which then feeds the electrical signal through cables 430 and back to the electrical component 116 via the receive port 250. The electrical signal proceeds through the receive circuitry 270 and exits the electrical component 116 as a Data Out electrical signal 330 from the electrical interface 230.

FIG. 4A shows two cables 430 because electrical signals that flow through the electrical component 116 of an optoelectronic transceiver are usually differential signals and require two cables to transmit. In other embodiments, other signals may be used for which only one or more than two cables are required for transmission.

Preferably, the connection between electrical component 116 and loop back connection 410 (including flex circuit 420 and cables 430) is made using temporary connections as permanent connections, such as soldered connections, directly to electrical component 116 may harm the electrical component when the loop back connection 410 is removed in order to assemble the TOSA and ROSA components to the electrical component. Systems and methods for forming a temporary connection between the electrical component 116 and loop back connection 410 are described further below.

Figure 4B:
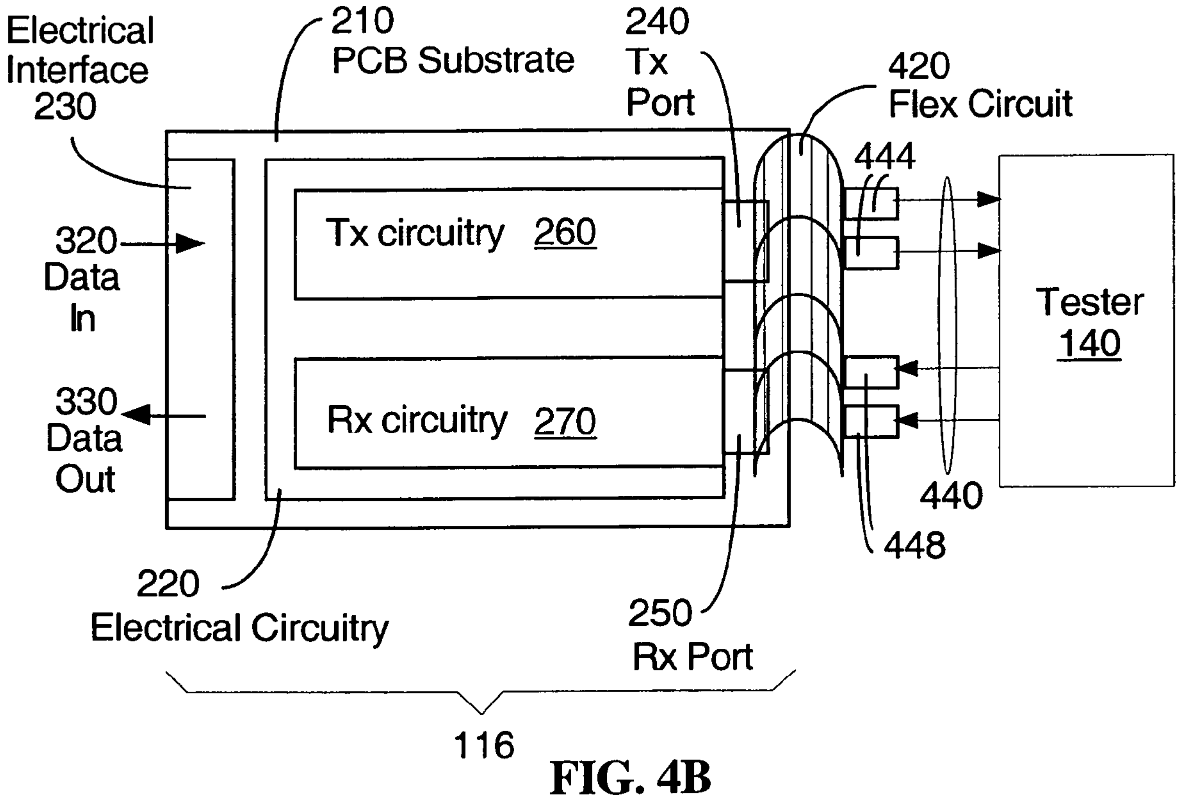
FIG. 4B is a block diagram of the electrical component of an optoelectronic transceiver with parallel connections to a tester.

FIG. 4B is the same as FIG. 4A, except that the loop back connection 410 is replaced by parallel connections 440 to a tester 140. The parallel connections 440 may be formed using two pairs of coaxial cables, one pair for transmit data and the other for receive data. In some embodiments, it may be advantageous to test the output of the transmitter circuitry 260 independent of the receiver circuitry 270, and to test the operation of the receiver circuitry 270 independent of the transmitter circuitry 260. For instance, if the electrical component fails a test using an electronic assembly tester with a loop back connection of FIG. 4A, the electrical component can then be tested using an electronic assembly tester with parallel inputs and outputs of FIG. 4B so that the problem with the electrical component can be isolated, at least in most cases, to being either in the transmitter circuitry 260 or in the receiver circuitry 270.

Figure 4C:
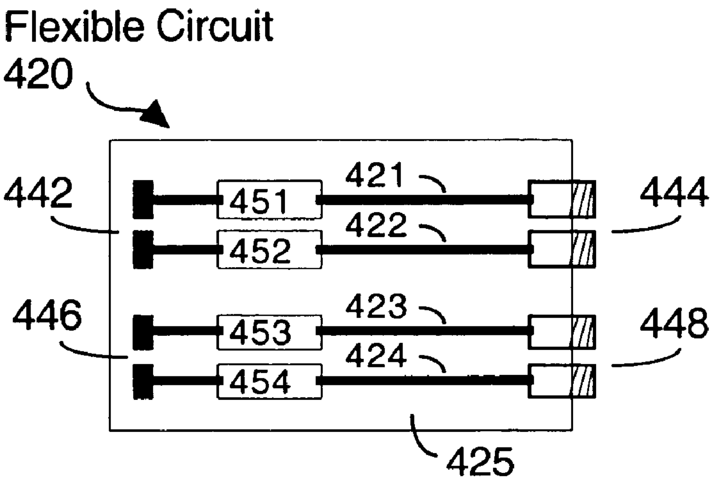
FIG. 4C depicts a flexible circuit component of an electronic assembly tester.

As shown in FIG. 4C, the flexible circuit 420 includes two pairs of traces 421-422 and 423-424, for conducting transmit and receive differential signals. The traces are formed on a flexible dielectric substrate 425. The dielectric substrate 425 serves as an insulator between a ground signal conductor on the back side of the dielectric substrate 425 and the data signal traces 421-424 and circuits 451-454 on the front side of the dielectric substrate 425. The dielectric substrate 425 is preferably polyimide film or polyester. Other insulating materials may be used besides polyimide or polyester.

The transmit traces 421-422 are coupled between a first pair of pads 442 and a first pair of connectors 444. The receive traces 423-424 are coupled between a second pair of pads 446 and a second pair of connectors 448. The connectors 444, 448 are preferably configured for connection to coaxial cables (e.g., by having screw threads compatible with the screw threads of coaxial cable connectors). These coaxial cables may form the loop back connection 410 using the cables 430 shown in FIG. 4A, or may form parallel connections 440 to and from a tester 140, as shown in FIG. 4B.

In one embodiment, circuits 451-454 are signal attenuation circuits for use with the loop back coaxial cables 430. The attenuation circuits 451-454 attenuate the data signals output by the transmit circuitry 260 (FIG. 4B) so that the signals received by the receive circuitry 270 have an expected amplitude level. From another viewpoint, circuits 451-454 attenuate the signals by an amount associated with use of a transceiver (containing the electrical circuit 116) in a particular application. In another embodiment, circuits 451-454 are designed to match the impedance of the flexible circuit 420 to the impedance of the transmit and receive circuits 260, 270. Alternately, circuits 451-454 may perform both impedance matching and signal attenuation functions. Further alternate embodiments may include coaxial in-line attenuators on the cables 430 in place of or in addition to attenuation circuits 451-454.

Electronic Assembly Tester

Figure 5:
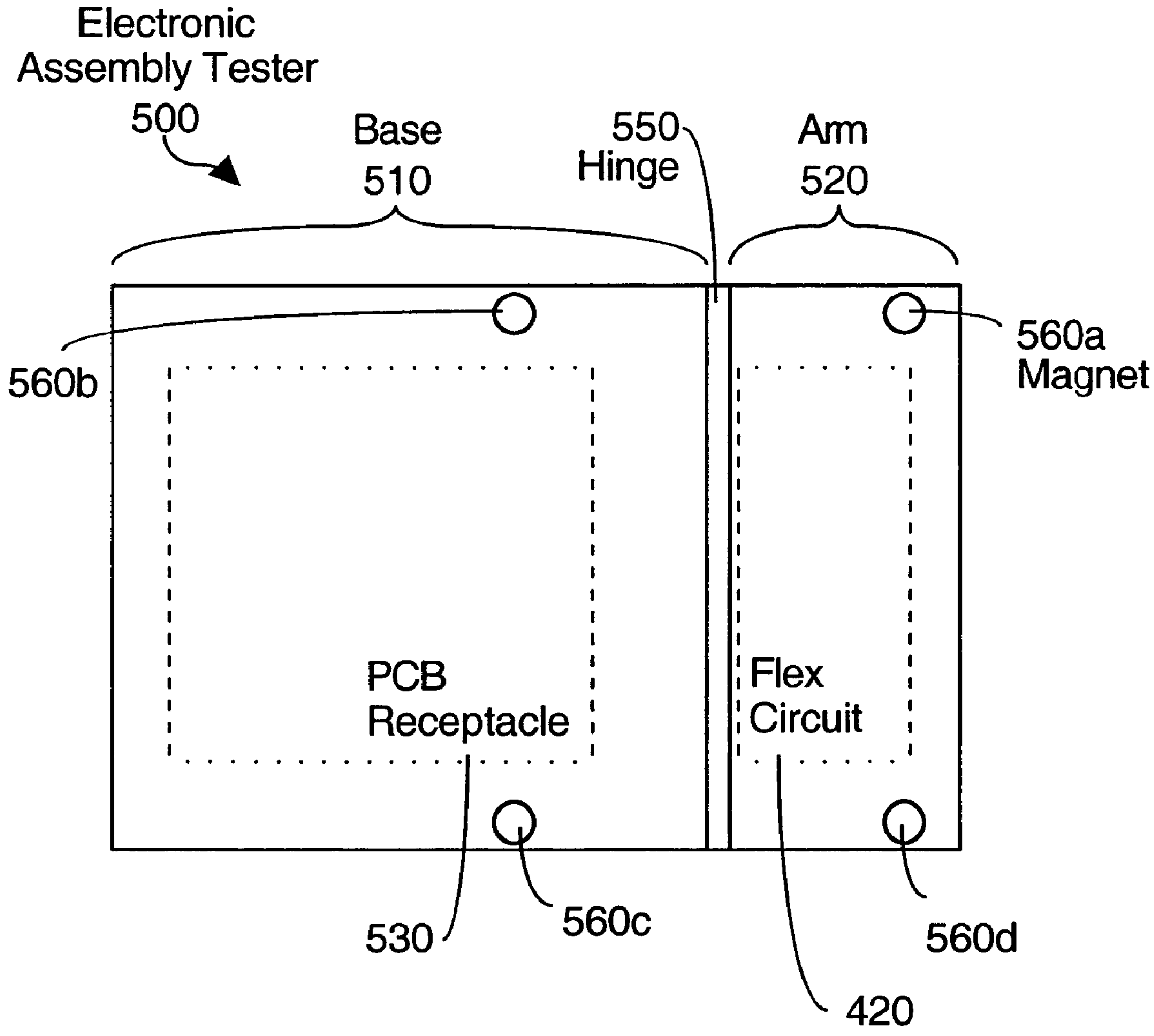
FIG. 5 is a block diagram of an electronic assembly tester.
Figure 6:
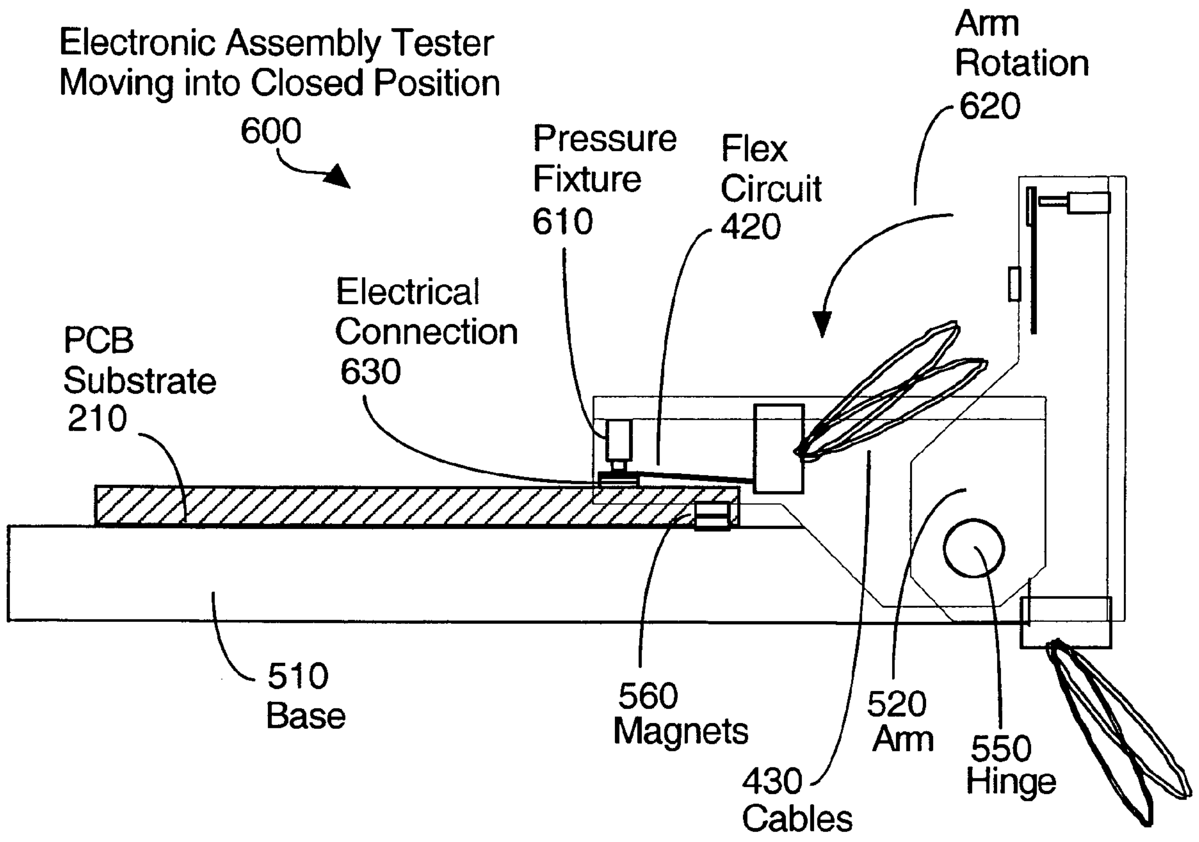
FIG. 6 is a block diagram of the electronic assembly tester's arms when the hinge is in the open and the closed positions.

With reference to FIG. 5, an exemplary electronic assembly tester 500 is shown. Electronic assembly tester 500 is a device that forms a temporary loop back connection for the electrical component of an optoelectronic transceiver. The electronic assembly tester 500 includes a base 510, an arm 520, and a hinge 550 connecting the base 510 to the arm 520. FIG. 5 is a plan view of the tester 500 with the arm 520 in the open position. When in the closed position, the hinge 550 allows the arm 520 to be adjacent to the base 510 in such a way as to create a temporary connection between an electrical component 116 and a flex circuit 420. The base 510 includes a PCB receptacle 530 for receiving the electrical component 116. In FIG. 5, the device is in the open position and the loop back connection 410 is underneath the device and is therefore not shown in FIG. 5. As shown in FIG. 6, the arm 520 includes the loop back connection made up of a flex circuit 420 and cables 430. When the embodiment of FIG. 4B is used, the parallel connection 440 replaces the cables 430.

In one embodiment, magnets 560$a$-560$d$ are included in the base 510 and/or the arm 520, and are positioned in such a way as to secure a temporary connection between the electrical component 116 and the flex circuit 420 when the arm 520 and hinge 550 are placed in the closed position (FIG. 6). Preferably, at least one magnet 560 is included in the base 510 or arm 520 for this purpose. The magnet(s) 560 help to press electrical connectors (e.g., pads 442, 446 of FIG. 4C) on the flex circuit 420 against the transmit port 240 and receive port 250 (FIGS. 4A, 4B) of the electrical component 116. In some embodiments, the magnet(s) 560 are used in combination with pressure fixtures 610 (FIGS. 6 and 7) to press traces 421-424 on the flex circuit 420 against the transmit port 240 and/or the receive port 250. The pressure fixtures 610, sometimes called "pogo pins," may include spring loaded pins that are aligned with traces on the flex circuit 420, but positioned on the opposite side of the flex circuit 420 as the traces. An alternate embodiment, having neither magnets nor pogo pins is discussed below with reference to FIG. 10.

Figure 7:
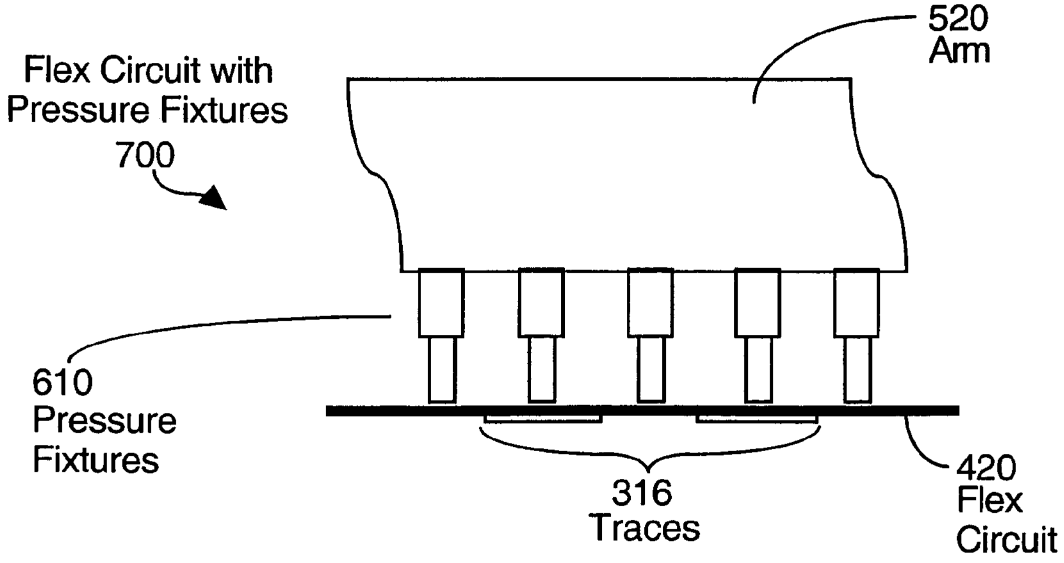
FIG. 7 is a block diagram of the electronic assembly tester's arm with pressure fixtures positioned in relation to the flexible circuit.

In FIG. 7, a close up view of the arm 520 is provided. Recall that the arm includes the loop back connection 410, which is further composed of a flex circuit 420 and cables 430. FIG. 7 shows the flex circuit 420 and its traces 316 (which generally represent traces 421-424), as well as pressure fixtures 610 attached to the arm 520. The traces 316 on the flex circuit form the data input 312 and the data output 314 of the flex circuit (see FIG. 9). Since the electrical signals associated with optoelectronic transceivers are usually differential signals, the data input 312 and the data output 314 are each composed of two traces 316. The flex circuit 420 is positioned on the arm 520 such that the pressure fixtures 610 are between the arm 520 and the flex circuit 420.

Figure 8:
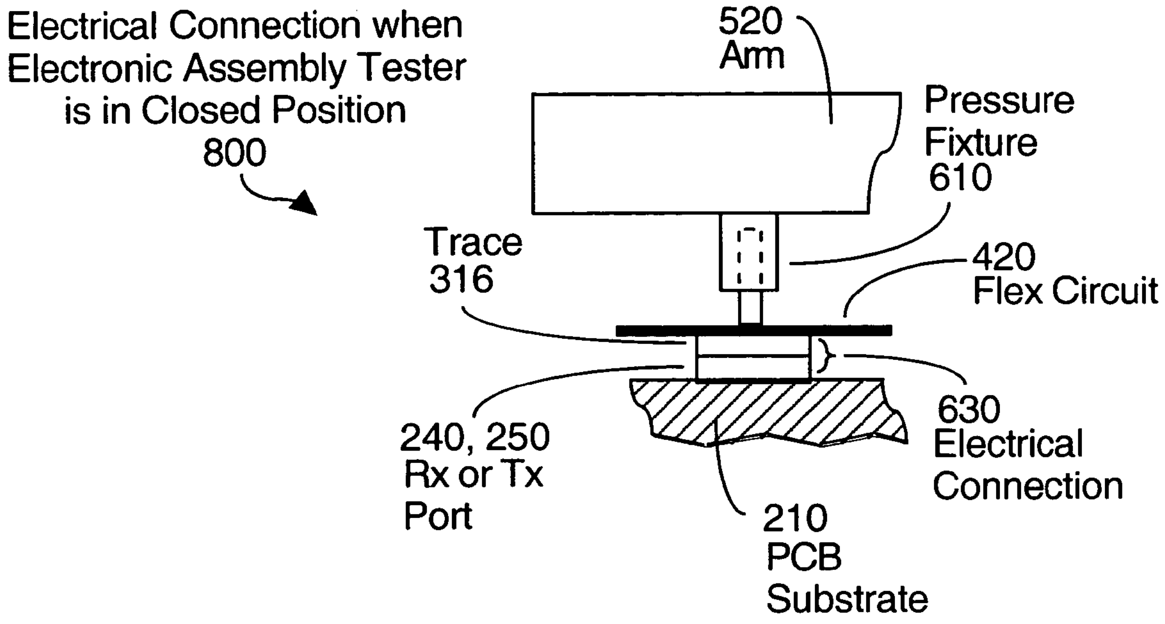
FIG. 8 is a block diagram of the electrical connection formed when the tester's hinge is in the closed position.

FIG. 8 shows electrical connections created when the arm 520 of the electronic assembly tester is in a closed position. In the closed position, trace 316 of flex circuit 420 contact the transmit port 240 and/or the receive port 250. Such contact between a trace 316 and a transmit port 240 and/or receive port 250 forms an electrical connection 630. FIG. 8 is a close up view and shows only one electrical connection 630.

Figure 9:
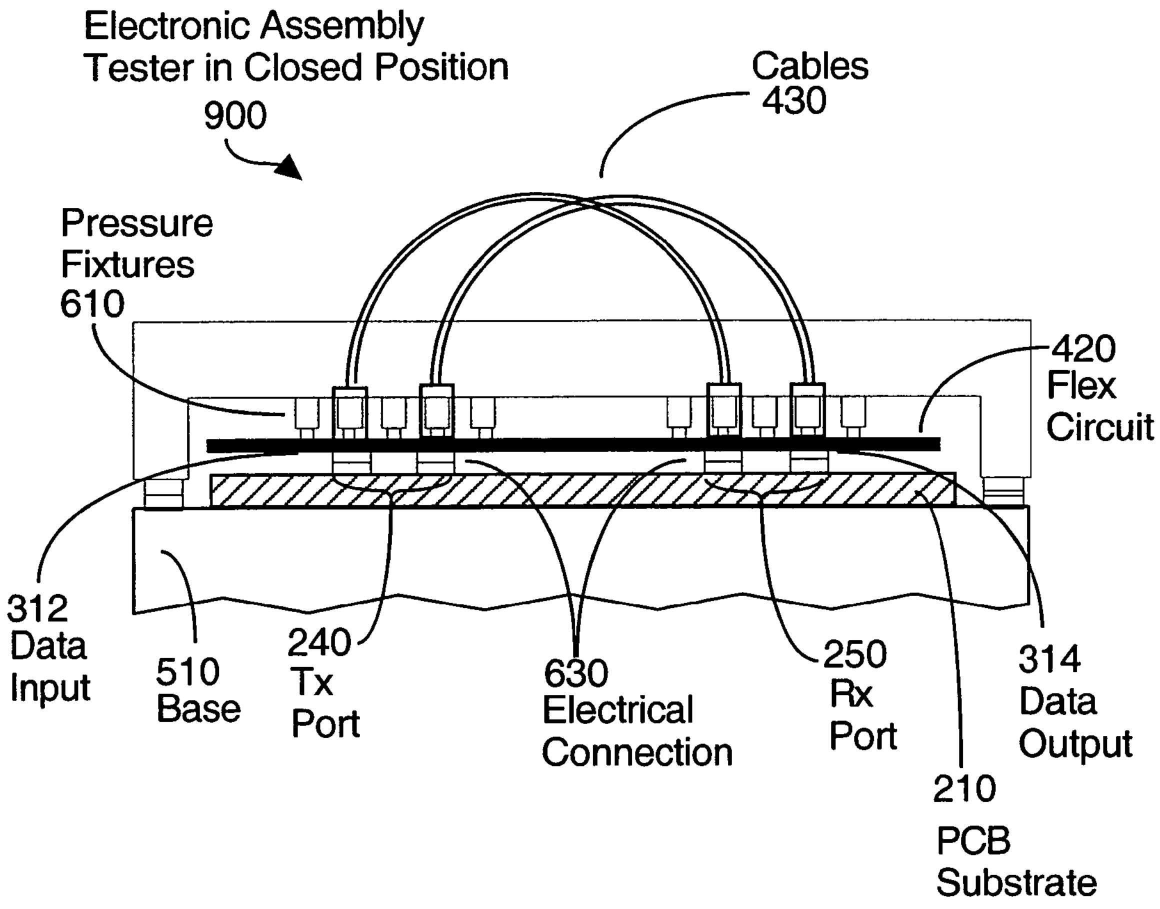
FIG. 9 is a block diagram of a temporary electrical connection created by the flex circuit and the cables of the electronic assembly tester of FIGS. 5, 6 and 7.

FIG. 9 is an expanded view and shows the temporary electrical connection 630 between the transmit port 240 and the data input 312, and between the data output 314 and the receive port 250. The flow of electricity when the temporary electrical connections 630 are formed is as follows: electricity flows from the transmit port 240 to the traces on the flex circuit 420 that constitute the data input 312, from the data input 312 to an end of the cables 430, from the other end of the cables 430 to the traces on the flex circuit 420 that constitute the data output 314, and from the data output 314 to the receive port 250.

Figure 10:
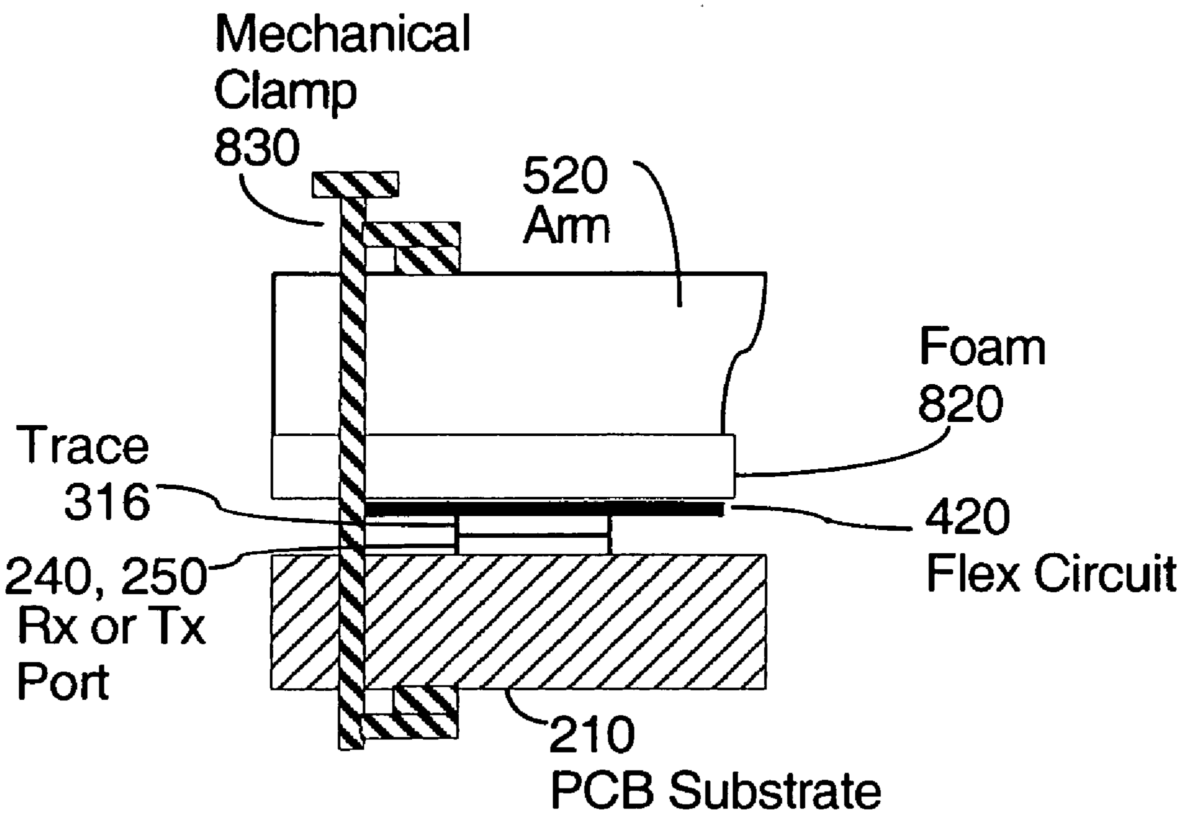
FIG. 10 depicts an alternate embodiment of an electronic assembly tester.

FIG. 10 shows an alternate embodiment of the electronic assembly tester. This embodiment uses a mechanical clamp 830, tightened by a screw mechanism, for holding the flex circuit 420 on the arm 520 firmly against the electrical component 116. Thus, the mechanical clamp 830 can replace the magnets 560 and/or pressure fixtures 610.

In another embodiment, the "pressure fixture" a firm foam 820 or any other stiff planar material. The foam 820 presses traces 316 (e.g., pads 442, 446 of FIG. 4C) on the flex circuit 420 against corresponding transmitter and receiver ports 240, 250 when the arm 520 is held against the electrical component 116 by the mechanical clamp 830. In addition, the foam 820 may be used in conjunction with other means for forming a temporary connection between the flex circuit 240 and electrical component 116 including, but not limited to, magnets 560 (FIG. 5) or any other clamping mechanism.

Figure 11:
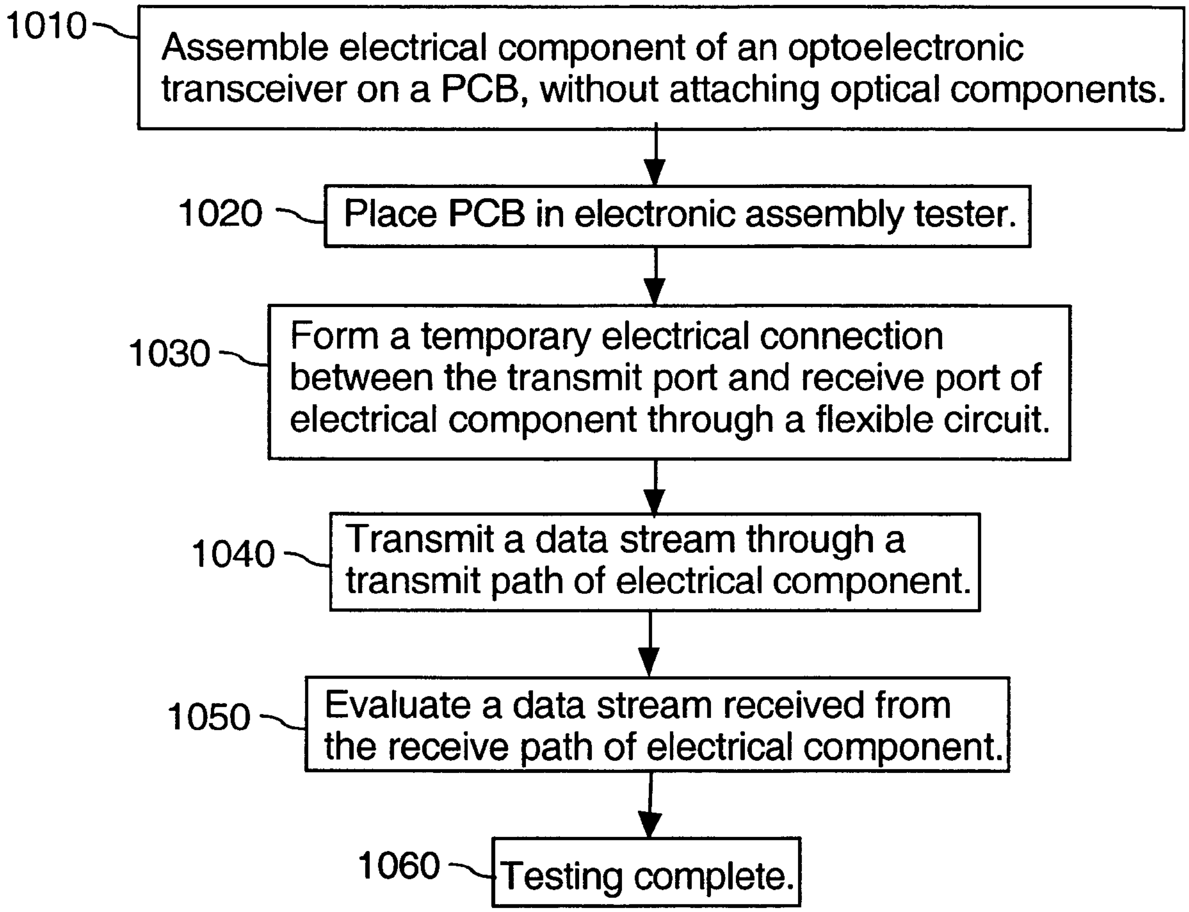
FIG. 11 is a flowchart of the general method in which the electronic assembly tester may be used to test the electrical component of optoelectronic devices.

Methods for Using the Electronic Assembly Tester to Test Electrical Components of Optoelectronic Devices FIG. 11 is a flowchart of a method for testing an optoelectronic device's electrical component 116. At step 1010, to test an electrical component 116 of an optoelectronic transceiver, an electrical component 116 must first be assembled. This electrical component 116, if joined with a pair of optical components 340, would form an optoelectronic transceiver. For the present invention, however, the goal is to test an optoelectronic transceiver's electrical component 116 before it is joined with optical components 340. Therefore, an optoelectronic transceiver's electrical component 116 must first be assembled without attaching the transceiver's optical components.

At step 1020, the electrical component 116, which includes a PCB 210, is placed in the PCB receptacle 530 located in the base 510 of an electronic assembly tester 500 (FIG. 5). At step 1030, the hinge 550 of the electronic assembly tester 500 is then placed in the closed position to form a temporary connection between the transmit port 240 and/or the receive port 250 of the electrical component 116. At step 1040, a data stream is then transmitted through a transmit path of the electrical component 116. Subsequently, a data stream is received from the receive path of the electrical component. At step 1050, this received data stream is evaluated to determine whether the electrical component 116 is functioning properly.

Figure 12:
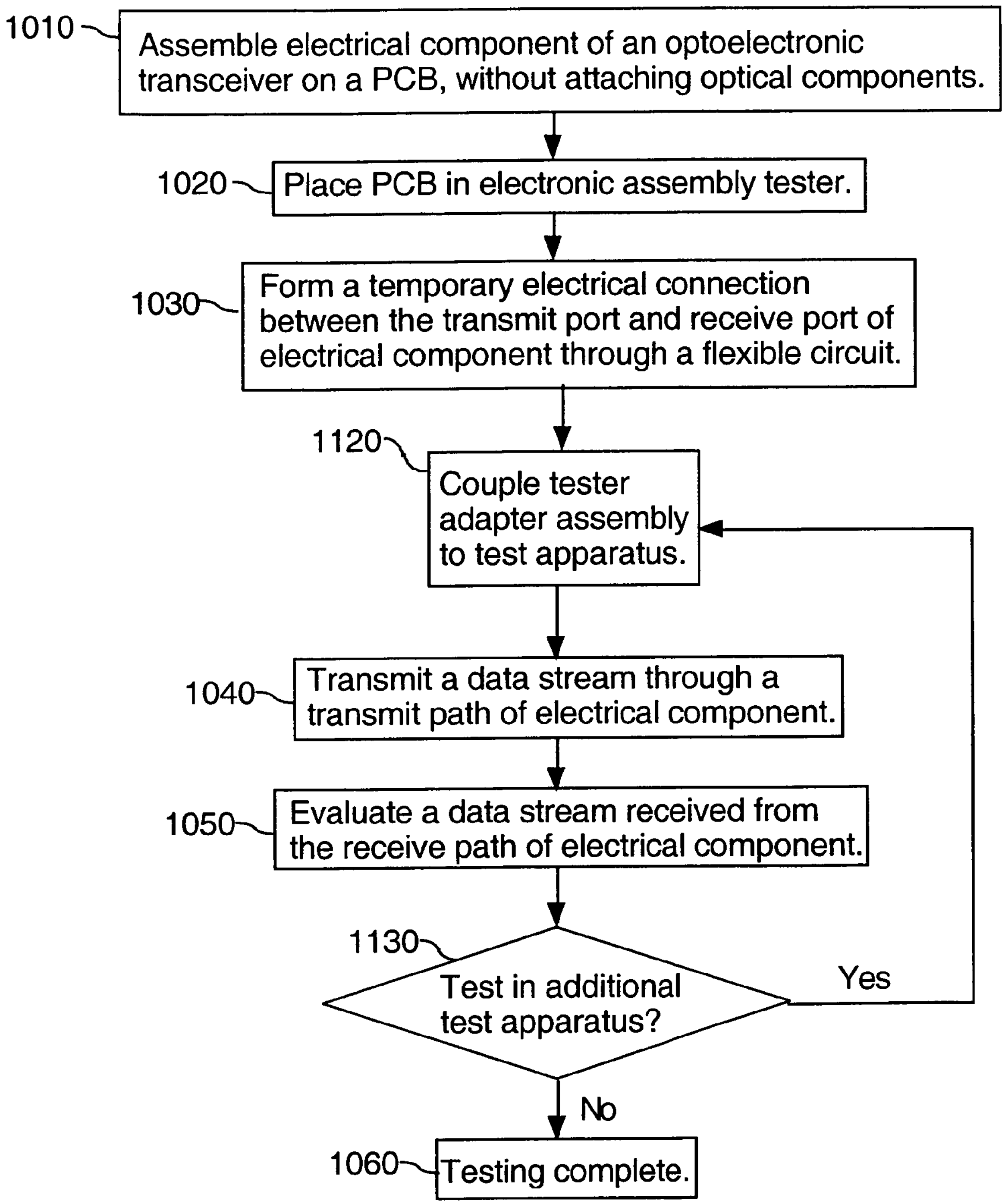
FIG. 12 is a flow chart of a method of testing an electrical component using multiple test apparatuses.

With reference to FIG. 12, the electronic assembly tester 500 of the present invention can be used to test an electronic component 116 with multiple testers (or test apparatuses). The testing method begins similar to that in FIG. 11. That is, steps 1010 through 1030 are similar. At step 1120, after forming a temporary electrical connection between the transmit and receive ports 240, 250, but before transmitting a data stream through a transmit path of the electrical component 116, the electronic assembly tester is coupled to a test apparatus.

If multiple test apparatuses are to be used to test the same electrical component 116, the electronic assembly tester 500 (still having the electrical component 116 disposed therein) may be coupled to a sequence of different test apparatuses. While coupled to each test apparatus, at step 1040, a data stream is transmitted to the transmit path of the electrical component 116, and, at step 1050, the data stream received from the electronic component's receive path is evaluated. After completing the tests at each test apparatus, at step 1130, a determination is made as to whether the electronic assembly tester 500 should be coupled to yet another test apparatus. In this way, a single electrical component 116 can be tested with multiple test apparatuses using the same electronic assembly tester 500. In effect, the electronic assembly tester 500 is used as an adapter for connecting the electrical component 116 to the various test apparatuses.

Figure 13:
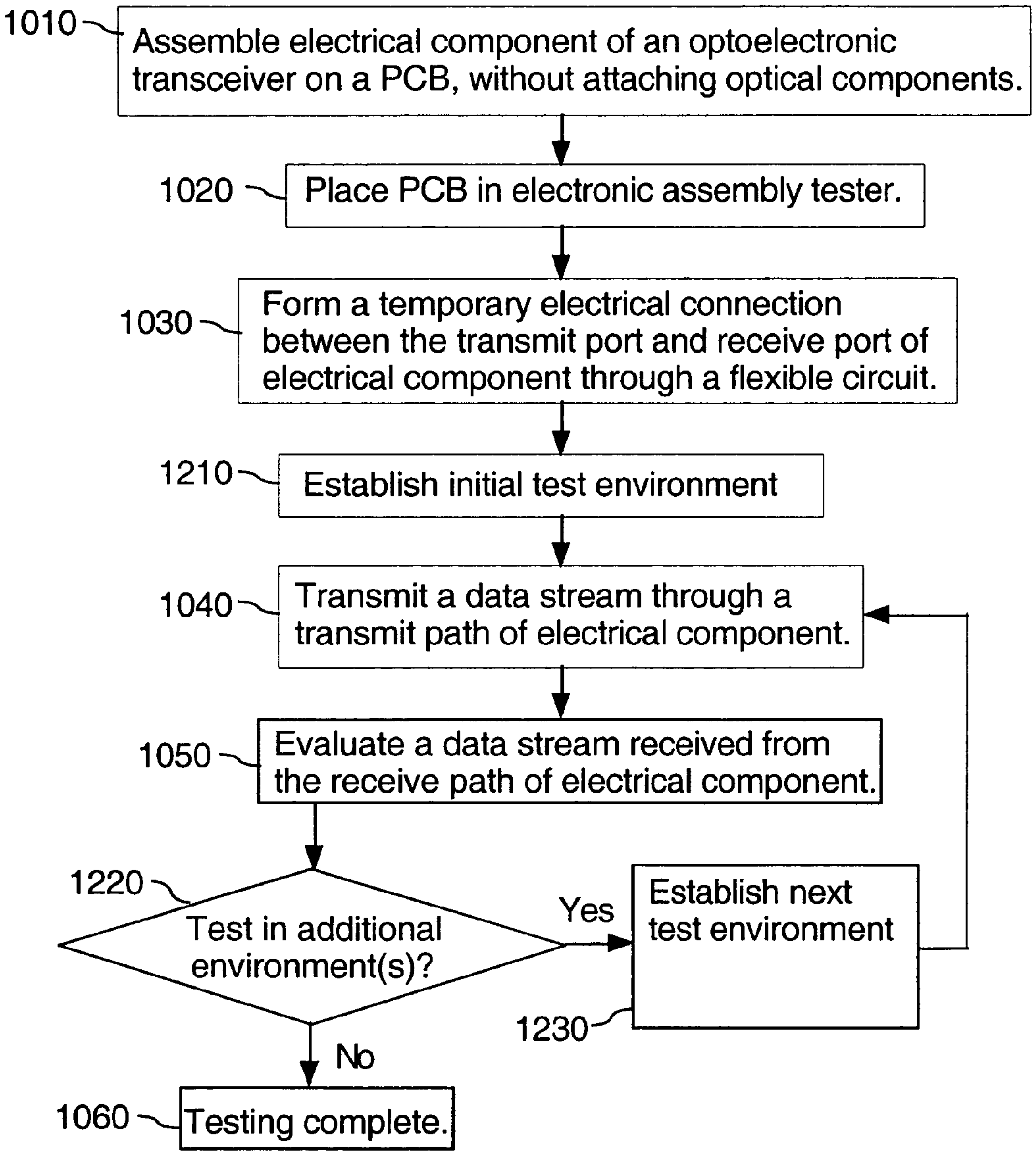
FIG. 13 is a flow chart of a method in which a single electrical component is tested in multiple test environments.

FIG. 13 is a flowchart of another alternative method that allows the same electrical component 116 to be tested in multiple test environments using the same electronic assembly tester 500. As before, the process begins with steps 1010, 1020, 1030, as described above. At step 1210, an initial test environment for the electrical component is established using suitable test equipment. At step 1040, a data stream is then transmitted to the transmit path of the electrical component, and, at step 1050, the data stream received from the electronic component's receive path is evaluated. At step 1220, it is determined whether the electronic component is to be tested in at least one additional test environment. If not, then at step 1060, the testing process is complete. However, if further testing is to be done, at step 1230, a next test environment for the electrical component is established and then steps 1040 and 1050 are repeated. The testing and environment establishing steps 1040, 1050, 1220, 1230 are repeated until testing of the electrical component in the various test environments is completed (step 1060). This process can be used to test the same electrical component 116 in multiple environments while using a single electronic assembly tester 500. Some test environments may include environments of differing temperatures or environments of differing signal strengths. Other environments may also be used.

Figure 14:
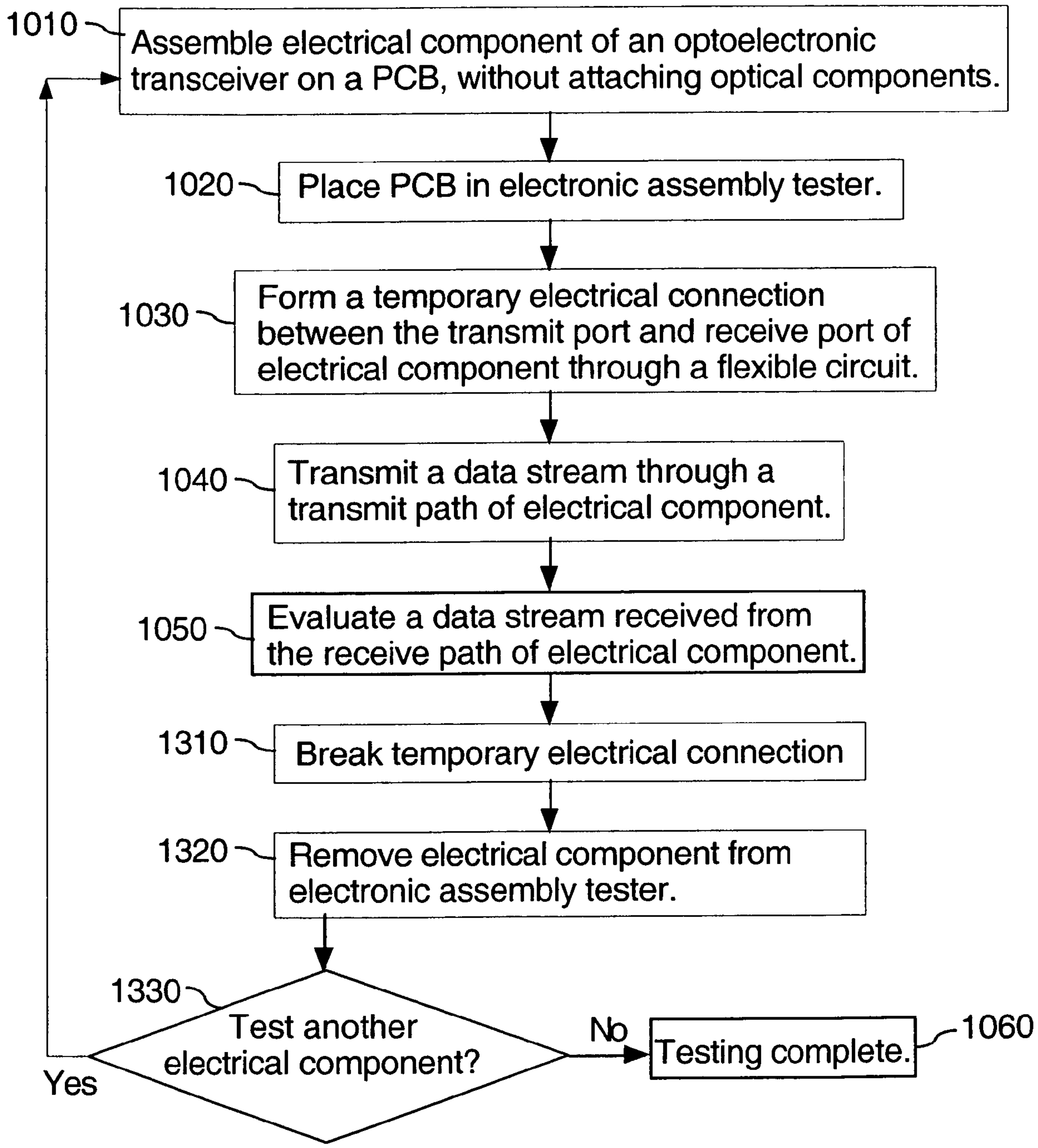
FIG. 14 is a flow chart of a method in which multiple electrical components are tested using a single electronic assembly tester.

As shown in the flowchart of FIG. 14, multiple electrical components 116 can be tested using the same electronic assembly tester 500. The flowchart of FIG. 14 is the same as that of FIG. 11, except as follows. After the data stream received is evaluated at step 1050, the temporary electrical connection between the transmit port 240 and the receive port 250 is released at step 1310 and the current electrical component 116 is removed from the electronic assembly tester 500 at step 1320. At step 1330, it is determined whether another electrical component will be tested. If not, at step 1060, the process ends. However, if an additional electrical component is to be tested, the procedure returns to step 1010 with the new electrical component to be tested.

The testing methodologies of FIGS. 11 through 14 can be combined so as to test an electrical component of a transceiver in multiple test environments, using multiple tester apparatuses, and furthermore so as to test multiple electronic components in these ways.

Variations and modifications to the apparatus of an electronic assembly tester and the methods for using such may be made to maximize the utility of the electronic assembly tester. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An assembly for testing electrical components of optoelectronic devices before the electrical components are connected with the optical components of the optoelectronic device, the assembly comprising:

a base having a printed circuit board receptacle configured to receive a printed circuit board of an electrical component; and an arm connected to the base, the arm comprising:

a flexible circuit having a data input and a data output; and cable connectors connected to a first end of the flexible circuit and configured to physically and electrically interface with respective cables, wherein the arm is selectively positionable between an open and a closed position, wherein in the closed position, a temporary electrical connection is formed between at least one of:

the data input and a transmit port of the electrical component, and the data output and a receive port of the electrical component, wherein a plurality of pads are positioned at a second end of the flexible circuit configured to at least partially form the temporary electrical connection.

2. The assembly as recited in claim 1, wherein the arm is pivotally connected to the base.

3. The assembly as recited in claim 1, the arm further comprising at least one pressure fixture for applying pressure to the data input connection and data output connection of the flexible circuit against the transmit port and receive port of the electrical component, respectively, when the arm is in the closed position.

4. The assembly as recited in claim 3, wherein the at least one pressure fixture comprises a spring loaded pin.

5. The assembly as recited in claim 3, wherein the at least one pressure fixture comprises a piece of foam.

6. The assembly as recited in claim 1, the base and arm further comprising at least one magnet disposed thereon for assisting the arm in forming the temporary electrical connection between the flexible circuit and the electrical component.

7. The assembly as recited in claim 1, further comprising:

a first cable connected to the data input; and a second cable connected to the data output.

8. The assembly as recited in claim 7, wherein the first and the second cables comprise coaxial cables.

9. The assembly as recited in claim 7, wherein the first cable and the second cable are the same cable.

10. The assembly as recited in claim 1, wherein the flexible circuit further comprises:

a data transmit port; and a data receive port, wherein the data transmit port and the data receive port are configured to be electrically connected to a tester apparatus.

11. The assembly as recited in claim 10, wherein when the arm is in the closed position, a temporary connection is formed between at least one of:

the transmit port of the electronic component and the data transmit port of the flexible circuit, and the receive port of the electronic component and the data receive port of the flexible circuit.

12. The assembly as recited in claim 1, further comprising a host computer configured to be placed in electrical connection with the printed circuit board of the electrical component.

13. The assembly as recited in claim 1, wherein the transmit port and receive port of the electrical component are configured to be coupled to a transmitter optical assembly and a receiver optical assembly, respectively.

14. The assembly as recited in claim 1, further comprising a mechanical clamp for applying pressure to the data input connection and data output connection of the flexible circuit against the transmit port and receive port of the electrical component, respectively, when the arm is in the closed position.

15. The assembly as recited in claim 1, wherein the flexible circuit comprises:

a flexible dielectric substrate having a front side upon which the data input and the data output are positioned; and a ground conductor on a back side of the dielectric substrate.

16. An assembly for testing electrical components of optoelectronic devices before the electrical components are connected with the optical components of the optoelectronic device, the assembly comprising:

a base having a printed circuit board receptacle configured to receive a printed circuit board of an electrical component; and an arm connected to the base, the arm comprising:

a flexible circuit having a data input and a data output, the flexible circuit further comprising:

a flexible dielectric substrate having a front side upon which the data input and the data output are positioned; and a ground connector on a back side of the dielectric substrate; and cable connectors connected to a first end of the flexible circuit and configured to physically and electrically interface with respective cables, wherein the arm is selectively positionable between an open and a closed position, wherein in the closed position, a temporary electrical connection is formed between at least one of:

the data input and a transmit port of the electrical component, and the data output and a receive port of the electrical component.

17. An assembly for testing electrical components of optoelectronic devices before the electrical components are connected with the optical components of the optoelectronic device, the assembly comprising:

a base having a printed circuit board receptacle configured to receive a printed circuit board of an electrical component;

an arm connected to the base, the arm comprising:

a flexible circuit having a data input and a data output; and cable connectors connected to a first end of the flexible circuit and configured to physically and electrically interface with respective cables, wherein the arm is selectively positionable between an open and a closed position, wherein in the closed position, a temporary electrical connection is formed between at least one of:

the data input and a transmit port of the electrical component, and the data output and a receive port of the electrical component; and one or more magnets positioned on the base and the arm to assist the arm in forming the temporary electrical connection.

* * * * *